United States Patent
Song et al.

(10) Patent No.: US 7,649,935 B2
(45) Date of Patent: Jan. 19, 2010

(54) DIGITAL ADAPTIVE FEEDFORWARD HARMONIC DISTORTION COMPENSATION FOR DIGITALLY CONTROLLED POWER STAGE

(75) Inventors: Zukui Song, Waltham, MA (US); Michael W. Determan, Brighton, MA (US)

(73) Assignee: Sigmatel, Inc., Austin, TX (US)

( * ) Notice: Subject to any disclaimer, the term of this patent is extended or adjusted under 35 U.S.C. 154(b) by 658 days.

(21) Appl. No.: 11/198,383

(22) Filed: Aug. 5, 2005

(65) Prior Publication Data

US 2006/0034365 A1    Feb. 16, 2006

Related U.S. Application Data (60) Provisional application No. 60/600,477, filed on Aug. 11, 2004.

(51) Int. Cl.
*H03K 9/08*    (2006.01)

(52) U.S. Cl. ................. 375/238; 363/21.01; 363/21.05; 363/21.13; 363/21.11; 363/21.18; 363/26; 320/145

(58) Field of Classification Search .................. 375/238; 363/41, 21.05, 21.13, 21.01, 21.11, 21.18, 363/26; 320/145
See application file for complete search history.

(56) References Cited

U.S. PATENT DOCUMENTS

| | | | | |
|---|---|---|---|---|
| 5,182,558 A | | 1/1993 | Mayo | |
| 5,377,092 A | * | 12/1994 | Rowand et al. | ................ 363/41 |
| 5,559,467 A | * | 9/1996 | Smedley | ....................... 330/10 |
| 5,594,631 A | * | 1/1997 | Katoozi et al. | ................. 363/41 |
| 5,617,058 A | * | 4/1997 | Adrian et al. | .................. 330/10 |
| 5,694,029 A | * | 12/1997 | Hayes et al. | ................. 323/282 |
| 5,834,925 A | | 11/1998 | Chesavage | |
| 2002/0175662 A1 | * | 11/2002 | Sakurai et al. | ............... 323/312 |
| 2004/0046535 A1 | | 3/2004 | Duffy et al. | |
| 2004/0104772 A1 | | 6/2004 | Boscolo et al. | |

* cited by examiner

*Primary Examiner*—Mohammad H Ghayour
*Assistant Examiner*—Leila Malek
(74) *Attorney, Agent, or Firm*—Toler Law Group (57) ABSTRACT

A digital timing read back and an adaptive feedforward compensation algorithm to reduce harmonic distortion is disclosed. More specifically, the approach generates harmonic components digitally with the same magnitude but at an opposite phase to the output harmonic distortion. An antidistortion signal is generated and added to the input signal. The magnitude and phase of the harmonic distortion change with the modulation level or index and the frequency of the input signal. In addition, the harmonic distortion level varies significantly with different timing error statistics in different power devices. The inventive method takes the modulation level or index, the frequency of the input signal and the timing error statistics acquired through a digital read back circuit as input variables to determine the magnitude and phase of the anti-distortion signal.

4 Claims, 6 Drawing Sheets

Diagram of the Read Back Circuit

FIG. 1

System Diagram of Adaptive Digital Feedforward Harmonic Compensation

Diagram of the Read Back Circuit

FIG. 4

THD Performance of prototype system.

DIGITAL ADAPTIVE FEEDFORWARD HARMONIC DISTORTION COMPENSATION FOR DIGITALLY CONTROLLED POWER STAGE

This application claims priority from U.S. Application No. 60/600,477, filed Aug. 11, 2004, which is incorporated herein by reference in its entirety.

FIELD OF THE INVENTION

The present invention relates generally to an apparatus and method for reducing harmonic distortion in digital-input switching audio amplifiers. More specifically, the invention relates to digitally generating the harmonic components having the same magnitude but opposite phase as the output harmonic distortion in an effort to create an anti-distortion signal to correct the input signal and adapting the anti-distortion signal based on the power stage timing error.

BACKGROUND OF THE INVENTION

In recent years, the pulse width modulation (PWM) Class D digital audio amplifier has been of great interest within the consumer electronics industry due to its superior power efficiency compared to traditional Class A, Class B and Class AB analog amplifiers. Class D amplifiers have been designed with a digital input source and used digital signal processing ("DSP") to convert the pulse code modulation ("PCM") audio data into PWM data to drive an appropriate power device. However, the output audio quality of such a digital amplifier has not increased along with the increased efficiency. This is mainly due to the PWM induced distortion and various errors and noise disturbances that occur in different functional blocks of a digital Class D amplifier, i.e., timing errors that happen in the power stage switching devices, quantization noises and power supply disturbances.

Methods and algorithms have been invented to reduce the PWM induced distortion such as described in U.S. Pat. No. 5,617,058 to Adrian, U.S. Pat. No. 6,657,566 to Risbo and U.S. Pat. No. 5,559,467 to Smedley. For a typical power device, disturbances in power supply and timing errors caused by switching characteristics are usually the dominant sources of harmonic distortion at the output. Correction methods and circuits, such as that taught in Smedley, were designed specifically to compensate the power supply errors and variations. In general, previous attempts at correcting total harmonic distortion ("THD") for digital amplifiers utilized analog feedback from the switching power stage into various topologies.

An analog feedback loop in a digital input amplifier requires either the use of a high-speed feedback circuitry or the use of a high-precision/high-speed A/D converter Both of these choices require sensitive and precise electronics that are difficult to design and are expensive to implement in an integrated circuit ("IC"). With a well-regulated power supply or using other means of correcting for power supply errors, the level of distortion is determined mainly by the timing errors occurring in the power stage. Thus, it becomes possible to digitize the output of the switching power stage, not with a traditional multi-bit A/D converter, but rather a simple comparator circuit that outputs only a two-level, binary signal. This conversion can be performed simply and cheaply in standard complimentary metal-oxide semiconductor ("CMOS") digital IC processes. Since the power switch is driven directly by a digital signal, it is a simple operation to derive the timing error of the power switch.

SUMMARY OF THE INVENTION

A focus of this invention is to compensate the distortion caused by the switching power stage and improve the THD performance of the output signal.

In an embodiment of the invention, digital timing read back and an adaptive feedforward compensation algorithm are applied to reduce the harmonic distortion. More specifically, this approach generates the harmonic components digitally with the same magnitude but at an opposite phase to the output harmonic distortion. That is, to generate an anti-distortion signal, and add it to the input signal. The magnitude and phase of the harmonic distortion change with the modulation level or index and the frequency of the input signal. In addition, the harmonic distortion level varies significantly with different timing error statistics in different power devices. The inventive method takes the modulation level or index, the frequency of the input signal and the timing error statistics acquired through a digital read back circuit as input variables to determine the magnitude and phase of the anti-distortion signal. The variables of the compensation signal can also be adjusted for individual systems to compensate for fixed errors other than the power switch timing errors, such as errors caused by printed circuit board ("PCB") layout and component selection of both the switching power stage and low-pass filter. The compensation for errors of the low-pass filter is significant as most methods using analog feedback use a feedback signal before the low-pass filter and cannot correct for these errors. Currently most all-digital amplifier solutions utilize a chip-set solution, with a digital CMOS controller IC and a separate power switch IC. This inventive method can also function with any power switch IC or any discrete power switch design such as audio and motor control or as a single-IC solution containing both the controller and power device.

Further analysis shows that the dependence of the harmonics on amplitude, frequency and timing errors can be accounted for in separate stages. The ability to segment the error components simplifies the overall compensation algorithm significantly. For example, it is possible to generate a compensation signal first to correspond to the input amplitude, followed by an adjustment with respect to the timing error statistics and then another adjustment according to the input frequency. Since the timing error statistics vary between different power devices, it may be necessary to capture the statistical variations and update the compensation signal adaptively.

All of the adjustments of the compensation signal regarding the amplitude, frequency and timing error variations and data acquisitions can be accomplished by various methods, for example a Fast Fourier transform ("FFT") computation unit or spectrum analyzer, a defined polynomial model, or a look up table process. Among these approaches, using a look up table with linear interpolations for intermediate entries is appealing for simplicity, high efficiency and low cost. The look up table contains a set of reference values of harmonic distortion magnitudes and phases, timing errors, and the adaptation parameters for frequency and timing error variations at a few different input levels. To create the entries in the look up table, harmonic magnitudes and phases are first measured for each of the predetermined modulation levels. Similarly, the timing information at the output of the power device is measured and compared to the input of the power stage. The difference is defined as the timing error, and the statistics such as mean and variance of the error will be calculated from the measurements. The adaptation parameters are a set of known constant values derived from offline analysis based on data collected from a number of sample systems.

After the compensation, the signal goes through the conventional interpolation, noise shaping and PWM processes before it drives the power device to switch on and off. The output of the power device is usually lowpass filtered and delivered to a speaker load as presented in the art.

From a systematic view, the input signal first goes through an estimation block to estimate the amplitude (the modulation level or index) and the frequency of the input signal. Then, based on the estimated values, a set of harmonic coefficients will be retrieved from a look-up-table and adjusted according to the amplitude, then to the read back statistics from the power device, and finally to the frequency. The digitally generated harmonic samples will be added to the input signal in the harmonic compensation process. Then, the samples get up-sampled, noise shaped and pulse width modulated before it drives the power device to switch on and off. Finally, the output of the power device is low-pass filtered and delivered to the output load. The detailed design and algorithms for the estimation, adaptation, and compensations are presented in the following sections.

BRIEF DESCRIPTION OF THE DRAWINGS

The accompanying drawings, referred to herein and constituting a part hereof, illustrate the exemplary embodiments of the system and method for seamless switching of the present invention and, together with the description, serve to explain the principals of the invention, in which.

DETAILED DESCRIPTION OF THE INVENTION

Figure 1:
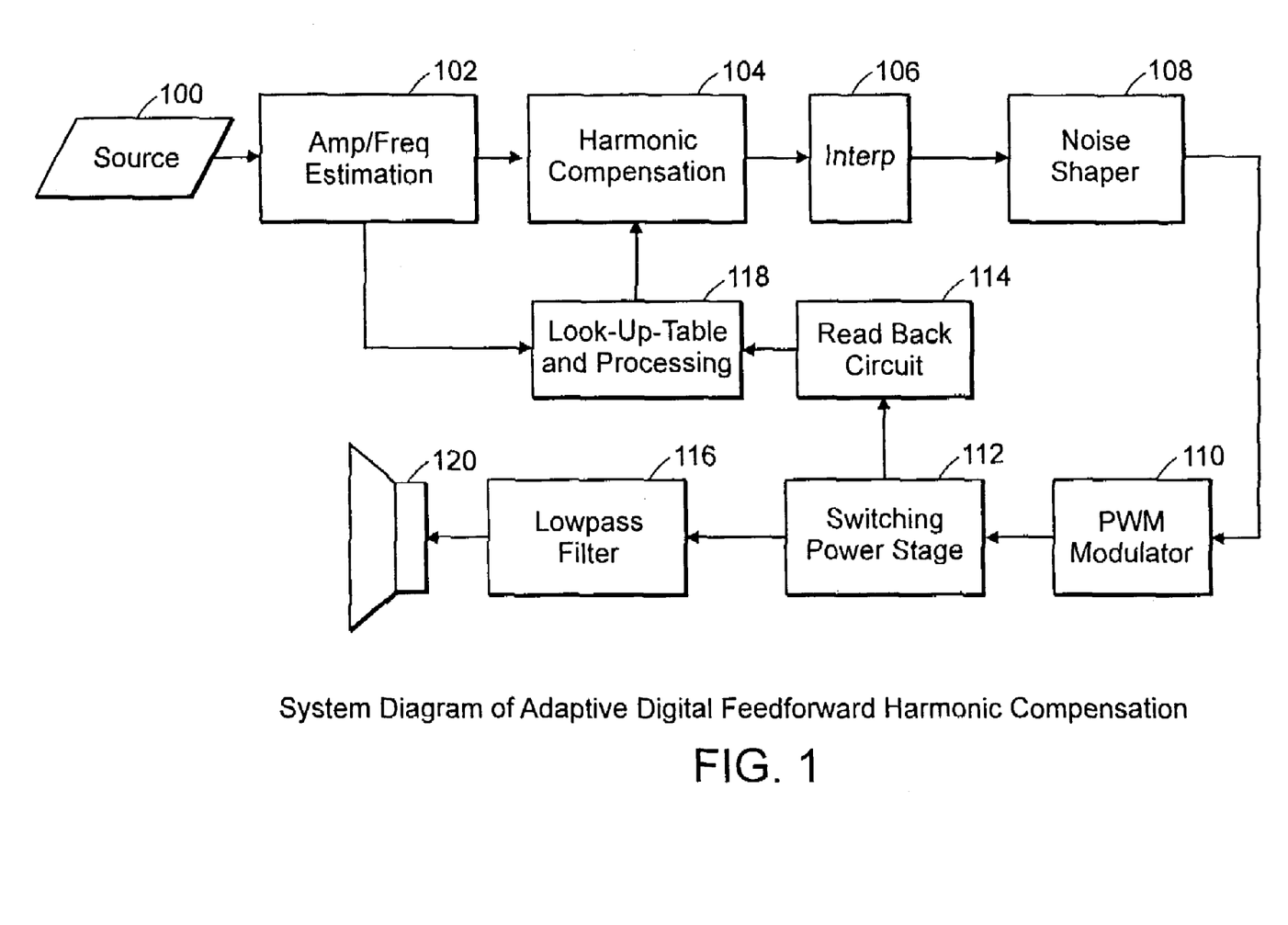
FIG. 1 illustrates a system diagram of adaptive digital feedforward harmonic compensation according to an embodiment of the invention.

Turning to FIG. 1, a system diagram of an illustrative embodiment of an adaptive feedforward harmonic compensation algorithm is depicted. A source or signal generator 100 sends a signal to an Amplitude and Frequency Estimation module 102 where the modulation level and the frequency of the input signal is initially determined based on estimated values. Next, the Harmonic Compensation module 104 determines the harmonic coefficients of the estimated signal by retrieving the values from a look-up table contained in the Look-up Table and Processing Module 118. The coefficients will be adjusted based on the magnitude of the signal and added to the signal in the Harmonic Compensation Module 104.

After the Harmonic Compensation module 104, the signal is passed through an interpolator 106 and a noise shaper 108, before it is pulse width modulated 110. The signal then arrives to drive a switching power stage 112. The output of the switching power stage is low-pass filtered 116 before it is delivered to the load 120. The timing information from the pulses of the switching power stage 112 is fed to the Read Back circuit 114 as an additional method to minimize the THD of the system.

Figure 3:
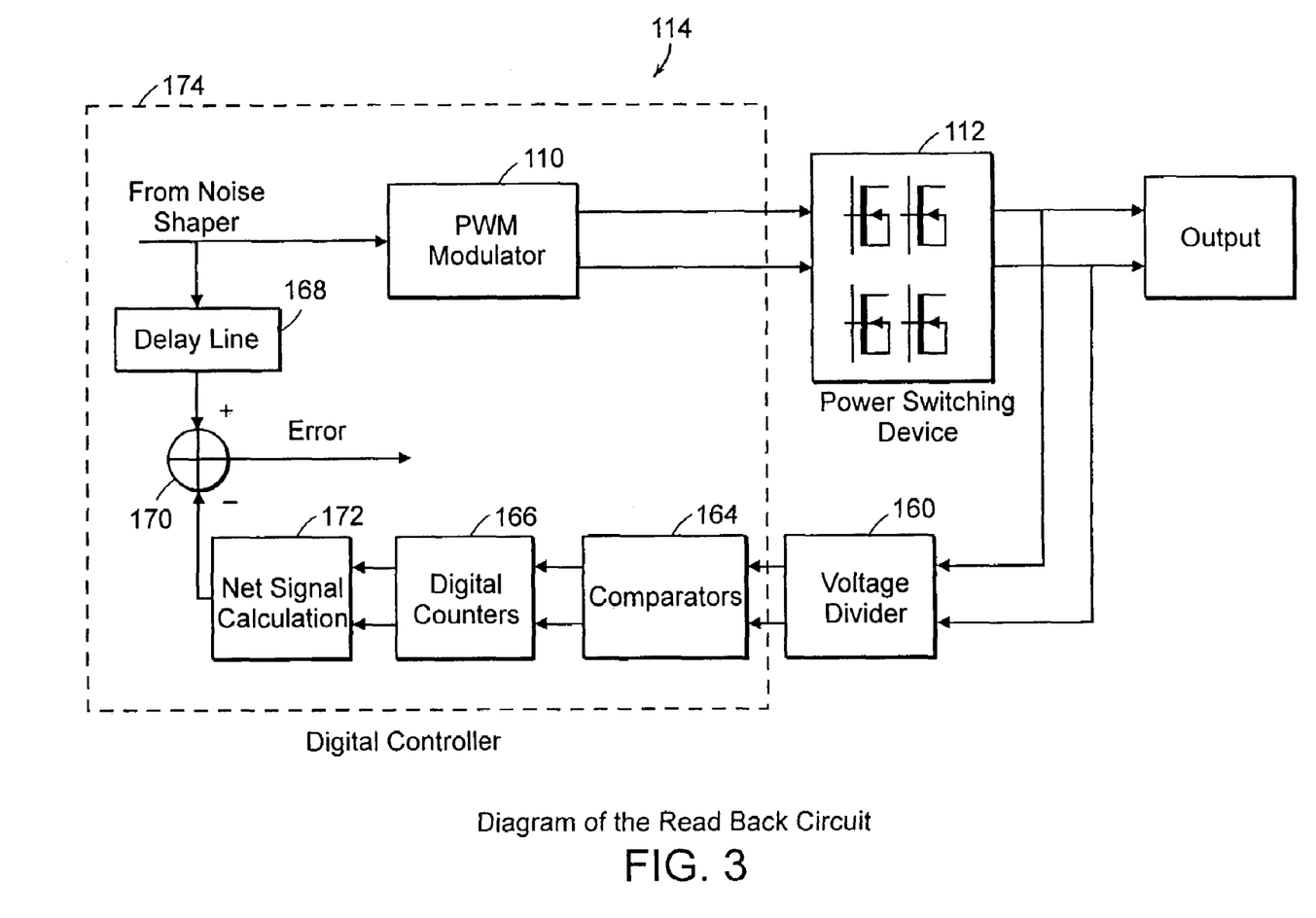
FIG. 3 illustrates a diagram of a read back circuit according to an embodiment of the invention.

The Read Back Circuit 114, shown in more detail in FIG. 3, receives the PWM pulses from the switching power stage 112 and sends the signal, after processing, to the Look-up Table and Processing module 118. The Look-up Table and Processing Module processes both the output of the Read Back Circuit 114 and the Amplitude and Frequency Estimation Module 102 to more accurately define the coefficients stored in the look-up table.

Figure 2A:
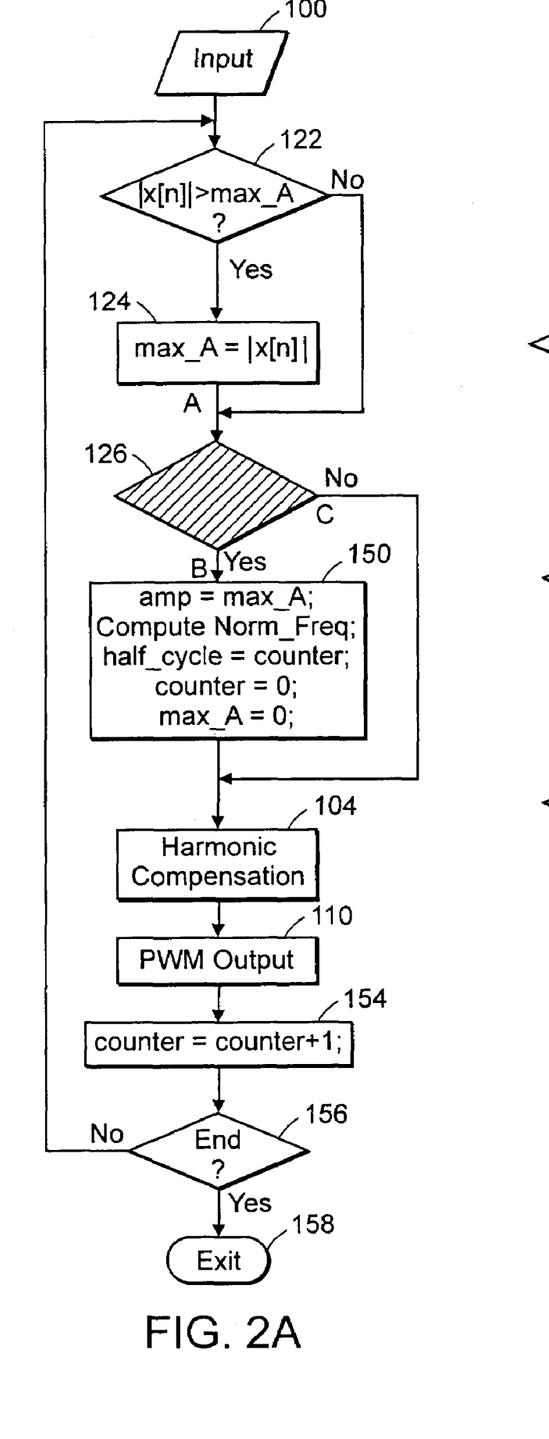
FIG. 2 illustrates a flowchart of a frequency and magnitude estimation according to an embodiment of the invention.
Figure 2B:
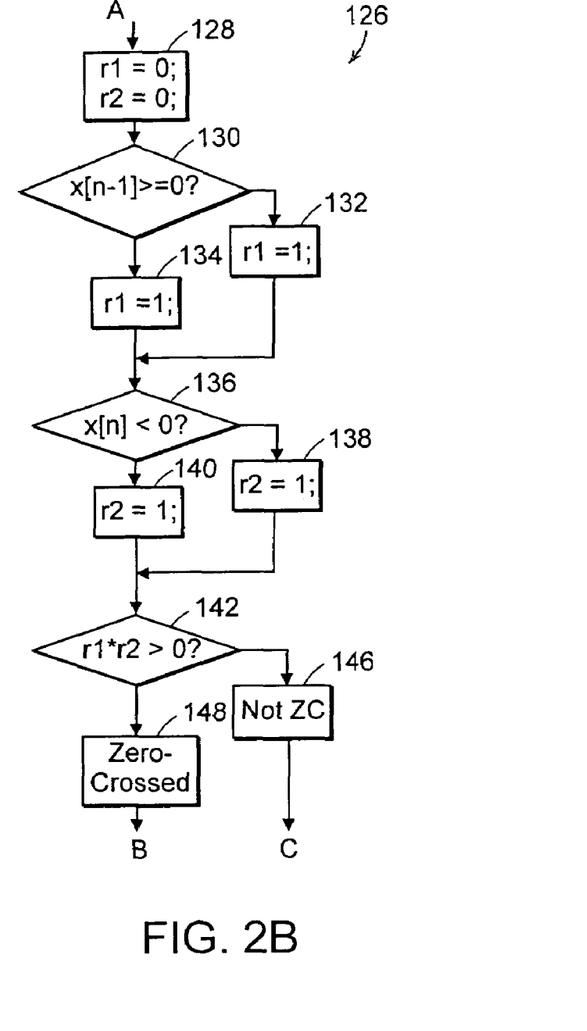

Turning now to FIG. 2A-B, a flowchart of a Frequency/Amplitude Estimation 102 algorithm, in accordance with an embodiment of the invention, is diagramed.

Amplitude and frequency estimation is critical because the harmonic distortion levels change with input amplitude and frequency. For a sine wave, the frequency and period of a sinusoidal signal can be estimated by the zero-crossing detection method, because the time interval between two consecutive zero-crossing instants equals one half cycle of the sinusoidal signal. For more complex input signals, a spectrum analyzer or Fourier analysis unit can be used to acquire the frequency components and the corresponding amplitudes. For convenience, a sine wave input has been assumed throughout this embodiment. In digital applications, exact zero-crossing may not be captured for each cycle of the input signal due to a finite sampling rate or a non-integer oversampling ratio. However, if the oversampling ratio is fairly large, which is true for most digital audio applications, we may approximate the zero-crossing time instants as the point in time where we detect that the two consecutive samples either equal zero or have opposite signs. Therefore, it is straightforward to estimate the period of the sinusoidal signal with this approach. The frequency is the inverse of the estimated period. To avoid division operations in real-time implementations, an alternative frequency estimation procedure is presented as follows.

In an illustrative embodiment, to estimate the frequency and magnitude, the input signal 100 is first compared to a maximum amplitude 122. If the amplitude of the input signal 100 is greater than the maximum amplitude, the input magnitude is set to equal the maximum amplitude 124. If the input amplitude is less than or equal to the maximum amplitude its value is unchanged. The input signal 100 is then zero-crossed 126 according to the algorithm depicted in FIG. 2B.

As shown in FIG. 2B variables r1 and r2 are initialized to zero 128. If the value of the input signal 100 at a previous time (t−1) is positive or zero 130 then r1 is set to one 134. If the input signal at time t−1 is negative, then r1 is set to a negative one 132. If the current value of the input signal 100 at time t is positive or zero 136 then the variable r2 is set to equal negative one 138. If the input signal 100 at time t is negative, then r2 is set to equal one 140. r1 and r2 are then multiplied 142 and if the result is positive then the input signal 100 during the time interval from t−1 to t has crossed zero. If the product of r1 and r2 is negative or zero, the input signal 100 has not crossed zero.

Turning back to FIG. 2A, if the output of the zero-crossed function 126 is Yes, that is the input signal has crossed zero between the time of t−1 and t, then the amplitude is set to equal the maximum amplitude and the normalized frequency is calculated. The counter and maximum amplitude are also set to zero 150. If the output value of the zero-crossed function 126 is No, the value of the input signal 100 is unchanged. The input signal 100 is then analyzed by the harmonic compensation algorithm 104 the PWM Module 110 and the counter is incremented by one 154. The input signal 100 is then fed back to the beginning of the beginning of the cycle 156 or passed on if the cycle has completed 158.

To calculate the normalized frequency, assume a sinusoidal input signal with unity amplitude (the normalized sinusoidal signal as explained below) $x(t)=\sin(2\pi ft)$, then the derivative of $x(t)$ with respect to t is $$\frac{dx(t)}{dt} = 2\pi f \cos(2\pi ft).$$

Thus, the frequency $f$ is given by $$f = \text{Maximum} \frac{1}{2\pi} \left\{ \left| \frac{dx(t)}{dt} \right| \right\},$$

and the normalized frequency, defined as the inverse of the oversampling ratio, is $$\frac{f}{f_s} = \text{Maximum} \frac{1}{2\pi f_s} \left\{ \left| \frac{dx(t)}{dt} \right| \right\} = \text{Maximum} \frac{1}{2\pi} T \cdot \left\{ \left| \frac{dx(t)}{dt} \right| \right\},$$

where $f_s$ is the sampling frequency and $$T = \frac{1}{f_s}$$

is the sampling interval. The derivative of $x(t)$ at $t=kT$ can be numerically approximated by the $3^{rd}$ order finite difference formula as $$\frac{dx(t)}{dt} = \frac{1}{T} \{h_0 x[k] + h_1 x[k-1] + h_2 x[k-2]\}, \text{ at } t = kT, \quad \text{(Eq. 1)}$$
where $h_0 = 3/2, h_1 = -2, h_2 = 1/2$.

Therefore, the normalized frequency is given by $$\frac{f}{f_s} = \text{Maximum}\left\{ \left| \frac{3}{4\pi} x[k] - \frac{1}{\pi} x[k-1] + \frac{1}{4\pi} x[k-2] \right| \right\}. \quad \text{(Eq. 2)}$$

Since, $x(t)=\sin(2\pi ft)$ and $$\frac{dx(t)}{dt} = 2\pi f \cos(2\pi ft)$$

have a 90 degree phase difference, it is easy to see that the maximum of $$\left| \frac{dx(t)}{dt} \right|$$

occurs at $t_0$ when $x(t_0)=0$, that is, the zero-crossing instant for $x(t)$.

The algorithm for the estimation of the period and normalized frequency of the input sinusoidal signal is summarized as follows.

(1). If the k th sample $x[k]=0$ or the sign of $x[k]$ is opposite to the sign of $x[k-1]$, let $t_1=k$;

(2) Compute the normalized frequency $$\frac{f}{f_s} = \left\{ \left| \frac{3}{4\pi} x[t_1] - \frac{1}{\pi} x[t_1 - 1] + \frac{1}{4\pi} x[t_1 - 2] \right| \right\};$$

(3). Repeat (1) unless another zero crossing time instant $t_2$ is found;

(4). The period of the input $x(t)$ is then $2(t_2-t_1)$ samples;

The amplitude of the input, A, can be determined using known algorithms. A simple moving average filter that approximates the root-mean-square ("RMS") amplitude of the signal can be used to find the amplitude of the input signal. The RMS of the amplitude more closely matches how the human ear perceives that amplitude. A peak sine method could be implemented, however the RMS method is an improvement better matching the perception of the music. The RMS amplitude will work both for correcting constant sine wave sources such as are used in lab testing and for music signals that will be used when listening to the amplifier.

After the Amplitude and Frequency Estimation module 102, the Harmonic Compensation module 104 computes the harmonic components of the input signal 100. An embodiment of the present invention employs the following algorithm in the computation of the harmonics of input signals. For convenience, it is assumed that the input signal 100 is a sine wave with an initial phase of zero. The harmonics of such a sine wave can be computed by using trigonometry formulas. To reduce the computational complexity in the digital domain, the input signal 100 is first normalized to have an unity amplitude of 1. The normalization is to multiply 1/A to the input sample A $\sin(2\pi fkT)$ and obtain the k th sample of the normalized input signal, $X=\sin(2\pi fkT)$. After A ($0<A\leq 1$) is estimated from the Amplitude and Frequency Estimation module 102, the Newton-Raphson algorithm is applied to calculate 1/A in an iterative way with only addition and multiplication operations. More specifically, a first function is defined, $$f(z) = \frac{1}{z} - A,$$

and the computation of 1/A becomes equivalent to search for the solution to $f(z)=0$. The Newton-Raphson algorithm states that the root of $f(z)$ is given by the following recursive equation.

$$z_{i+1} = z_i - \frac{f(z_i)}{f'(z_i)}, \quad \text{(Eq. 4)}$$

where $z_i$ is the i th trial and $f'(z)$ is the derivative of $f(z)$. The iterative solution to 1/A is given by substituting $$f(z) = \frac{1}{z} - A$$

into (Eq.4), to give $$z_{i+1} = z_i(2 - Az_i), \quad \text{(Eq. 5)}$$
$$= 2z_i\left(1 - \frac{A}{2}z_i\right), i = 1, 2, \ldots$$

An initial trial value, R, for the iterative algorithm is chosen based on the estimation of A for fast convergence, and four iterations is proven to provide sufficient accuracy. To implement the normalization process in a fixed-point operation, A is scaled up by $2^N$ (N=10 for this embodiment). The iterative algorithm is illustrated as the following virtual code:

$A = A*2^N;$

For $i = 1:4$ $a = R*A;$ $b = a/2;$ $c = 1-b;$ $d = R*c;$ $R = d*2;$

End $R = R *2^N,$

The value of R at the end of the iteration is approximately 1/A. After the normalization, the quadrate signal Y=cos(2πfkT), is first computed as $$Y = \cos(2\pi f k T) = \frac{1}{2\pi f} \frac{dx(t)}{dt} \text{ at } t = kT. \quad \text{(Eq. 6)}$$

The derivative of x(t) at t=kT can be numerically approximated by (Eq. 1). Therefore, $$Y = \frac{f_s}{2f}\left\{\frac{3}{2\pi}x[k] - \frac{2}{\pi}x[k-1] + \frac{1}{2\pi}x[k-2]\right\} \quad \text{(Eq. 7)}$$
$$= (t_2 - t_1)\left\{\frac{3}{2\pi}x[k] - \frac{2}{\pi}x[k-1] + \frac{1}{2\pi}x[k-2]\right\}.$$

Given X and Y, the higher order harmonics are computed using the multiple angle formulas as follows:

$$X_2 = \sin(4\pi fkT) = 2XY \quad \text{(Eq. 8)}$$

$$Y_2 = \cos(4\pi fkT) = 1 - 2X^2 \quad \text{(Eq. 9)}$$

$$X_3 = \sin(6\pi fkT) = 4X\left(\frac{3}{4} - X^2\right) \quad \text{(Eq. 10)}$$

-continued $$Y_3 = \cos(6\pi fkT) = 4Y\left(\frac{1}{4} - X^2\right) \quad \text{(Eq. 11)}$$

$$X_4 = \sin(8\pi fkT) = 2X_2Y_2 \quad \text{(Eq. 12)}$$

$$Y_4 = \cos(8\pi fkT) = 2Y_2^2 - 1 \quad \text{(Eq. 13)}$$

$$X_5 = \sin(10\pi fkT) = 2Y_2X_3 - X \quad \text{(Eq. 14)}$$

$$Y_5 = \cos(10\pi fkT) = Y\left(\frac{Y_4}{4} - X^2Y_2\right)4 \quad \text{(Eq. 15)}$$

If the corresponding phase for the i th harmonic is $\theta_i$, the compensating signal becomes $$C_i = g_i(X_i\cos(\theta_i) + Y_i\sin(\theta_i)), \quad \text{(Eq.16)}$$

where $g_i$ is the magnitude of the harmonic.

Turning now to FIG. 3, a block diagram of the Read Back Circuit 114 is depicted. A feedback circuit is designed to acquire the timing information of the pulses in a power device. Though the feedforward method is applicable without the Read Back Circuit 114 and will lower the THD of the system, the inclusion of the Read Back Circuit 114 and adaptation of generated harmonics, in this embodiment, will better reduce the THD over a number of systems. First, the Read Back Circuit 114 uses a voltage divider 160 to convert the high-voltage PWM pulses from the output of the switching power stage 112 into a low-voltage signal which is appropriate for the low voltage CMOS IC's to process. The rectangular PWM pulses at the input of the switching power stage 112 are usually distorted as they flow through the power device. For example, due to the charge and discharge characteristics of the switching power stage 112, the output pulses are more likely to have trapezoidal shapes with finite rising and falling edges instead of purely rectangular pulses. As commonly adopted, the time interval between the 50% levels on the rising and falling edges is measured as pulse widths. This is accomplished by using a pair of comparators 164, contained within the digital controller IC 174, to re-shape the pulse waveforms by comparing the low-level logic pulses with a DC reference voltage. The DC reference voltage can be a constant voltage or can be derived from the power supply in order to track any changes in voltage that may occur to the power supply. The re-shaped rectangular pulses are fed into a digital counter 166 to count the widths of these pulses. The digital counter 166 is running at the same digital clock frequency or higher than the PWM 110 output counters. There are two pulses per channel, when using the damped ternary Adrian patent method that enter independent counters comprising the positive and negative pulses corresponding to the two outputs of the full-bridge power stage. The difference of the two counters gives a net pulse signal that the switching power stage 112 has output. This method can also be modified to obtain the timing errors of a binary modulation using either a full-bridge or half-bridge power stage by recording the pulse widths of two consecutive pulses. The output of the noise-shaper 108 is delayed 168 by the number of cycles required for output of the PWM module 110 and input of the Read Back Circuit 114 signals. This delayed output of the noise shaper 108 is then compared 170 to the net signal calculation 172 from the Read Back circuit 114 every PWM output cycle. The difference between these two signals is the timing error of the switching power stage 112. It has been found that time resolution of 5 ns of the digital counters 166 is necessary to significantly increase the performance of current power device IC's. Smaller time resolutions detect smaller timing errors and perform better.

The total harmonic distortion at the output is related to the timing error of the pulses in the switching power stage 112. Based on collected power stage error data from the Read Back Circuit 114 the following linear equations can be used to describe the correlation between the timing errors and individual harmonic amplitudes reasonably well:

$$H_2 = a_2 VE + b_2, \quad \text{(Eq. 17)}$$

$$H_3 = a_3 DE + b_3, \quad \text{(Eq.18)}$$

$$H_4 = a_4 DE^4 + b_4, \quad \text{(Eq.19)}$$

$$H_5 = a_5 DE + b_5, \quad \text{(Eq.20)}$$

where VE is the variance of the net timing error E, and DE is the mean of the net timing error magnitude without the DC offset, that is MEAN(|E−MEAN(E)|). In one embodiment, the harmonic distortion coefficients $g_2$, $g_3$, $g_4$, $g_5$ and the corresponding timing error statistics VE_ref and DE_ref of a reference power device are stored in a look-up-table as an initial point of the adaptation process. When the timing error statistics change, the adaptation of harmonic compensation will be applied using the above equations as follows.

$$g_2' = g_2 + a_2(VE - VE\_ref), \quad \text{(Eq.21)}$$

$$g_3' = g_3 + a_3(DE - DE\_ref), \quad \text{(Eq.22)}$$

$$g_4' = g_4 + a_4(DE^4 - (DE\_ref)^4), \quad \text{(Eq.23)}$$

$$g_5' = g_5 + a_5(DE - DE\_ref). \quad \text{(Eq.24)}$$

To obtain the statistics of DE and VE, a first-order recursive moving average filter is used, $$H(Z) = \frac{1-\alpha}{1-\alpha Z^{-1}},$$

α is chosen as $$\alpha = \frac{4096}{4097}$$

so that the transfer function of H(Z) is equivalent to the one that averages 4096 samples over a moving window. H(Z) is applied to the net error signal E, the error magnitude without the DC offset |E−MEAN(E)| and $E^2$. The variance of E is therefore, $VE = MEAN(E^2) - (MEAN(E))^2$.

The Look-Up-Table (LUT) and Processing module 118 is used to contain the magnitude, phase and the adaptive parameter values for each harmonic. It is possible to design an output stage that is capable of computing the magnitudes and phases of the harmonics from the output waveform, for example an A/D converter followed by a FFT engine, as an alternative method to a LUT. In such a design, the system will start up from an all-zero initial state and automatically calibrate the feed-forward correction coefficients based on the feedback readings from the output stage in a short period of time. A look up table is favorable because of simplicity, high efficiency and much lower cost. The values in the LUT are acquired and processed from lab measurements over a reasonable number of sample systems. Generation of the coefficients requires applying the various parameters that the entries in the LUT represent, such as different amplitudes and frequencies of these signals. While each LUT entry is being output, the amplitudes of the harmonics are recorded via an audio measurement system, at the same time the VE and DE values of the Read Back Circuit 114 are recorded via digital communications with the controller 174. After several systems have been measured it becomes possible to calculate the VE_ref and DE_ref LUT values, which are the mean values for the VE and DE read over the tested systems for each particular LUT entry. It also becomes possible to calculate the harmonic amplitudes and phases at the VE_ref and DE_ref values this can be obtained directly from the lab measurements. The adaptation values will be computed using a linear square fitting model. An example for the second harmonic adaptation coefficient can be found below:

$$a_2 = \frac{L \sum_{i=1}^{L} H_{2i} VE_i - \sum_{i=1}^{L} H_{2i} \sum_{i=1}^{L} VE_i}{L \sum_{i=1}^{L} VE_i^2 - \left(\sum_{i=1}^{L} VE_i\right)^2}, \quad \text{(Eq. 25)}$$

where i represents the different systems tested from 1 to L, H and VE represent the read values of the second harmonic amplitude and VE. This is repeated for the higher order harmonics. The higher the number of systems tested the more accurate the adaptation coefficients become.

The frequency adaptation is computed by measuring the harmonic amplitudes at the base frequency($f_0$) and the high frequency($f_1$). In this embodiment the high frequency is set at 5 kHz, but this frequency is arbitrary. The equation for generating the frequency adaptation parameter for the second harmonic is:

$$P_2 = (H_2' - H_2) * f_s / (f_1 - f_0) \quad \text{(Eq.26)}$$

where $H_2'$ is the harmonic amplitude at $f_1$ and $H_2$ is the harmonic amplitude at $f_0$. Below $f_0$ the standard $a_2$ value is used, whereas above $f_0$ the $a_2$ value is modified using linear interpolation based on the detected frequency and value of $P_2$. This method is repeated for higher order harmonics. The frequency adaptation parameter is stored separately in the LUT as it is independent of amplitude and therefore only requires one entry. By adjusting the LUT values for a particular system design it becomes possible to not only compensate for the variable power switch timing errors but also for other fixed errors that may occur due to PCB layout or component selection in both the switching power stage 112 and output low-pass filter 116 sections of the hardware design. For example, other non-ideal components or distortions for mismatch in the system may be compensated. The values for the LUT can therefore either be stored in ROM in the digital controller IC for pre-determined power IC's and system designs or downloaded from a system micro-controller to internal RAM at start-up for custom or new power IC's and system designs.

Based on the estimated amplitude, the process searches for the corresponding entries for the harmonic coefficients, phases and adaptive parameter values and computes the new harmonic coefficients with the read back timing errors. Table 1 illustrates the structure of an embodiment of a LUT used to compensate the i th harmonic.

TABLE 1

Structure of the Look-Up-Table

| Amplitude | R | i th Harmonic | Slope | Phase | VE_ref | DE_ref | Adaptation |
|---|---|---|---|---|---|---|---|
| $A_1$ | $R_1$ | $g_{1i}$ | $s_{1i}$ | $Ph_{1i}$ | $VE_1$ | $DE_1$ | $a_{1i}$ |
| $A_2$ | $R_2$ | $g_{2i}$ | $s_{2i}$ | $Ph_{2i}$ | $VE_2$ | $DE_2$ | $a_{2i}$ |
| ... | ... | ... | ... | ... | ... | ... | ... |
| $A_n$ | $R_n$ | $g_{ni}$ | $s_{ni}$ | $Ph_{ni}$ | $VE_n$ | $DE_n$ | $a_{ni}$ |

The first column of the table is the amplitude entries which can be predetermined with specific spacing. Any spacing of amplitude entries is valid however, and can be selected for optimal performance from the power output and THD characteristics across the amplitude of the system. The second column contains the approximated inverse of the corresponding amplitude, $R_n$, for the normalization process use. The third column records the harmonic distortion coefficients of a reference system corresponding to the amplitude entries. The fourth column contains the slope of the harmonic coefficients between the consecutive amplitude entries for the purpose of linear interpolations. The fifth column is the phase information for the corresponding harmonic tone, in the form of cosine and sine values. VE_ref is the variance of the timing error of the switching device and DE_ref is the mean magnitude of the timing error subtracted from its own average. The last column is the adaptation coefficients which are used to adjust the harmonic coefficients from the reference system due to the differences in timing error statistics.

If the estimated amplitude is between two entry indexes, a linear interpolation is used to compute the corresponding harmonic coefficients.

For example, if the estimated amplitude A is between $A_1$ and $A_2$, the i th harmonic coefficient will be interpolated as $$g_i = g_{1i} + s_{1i}*(A - A_1). \quad \text{(Eq.27)}$$

For the phase and adaptation parameters, it is more efficient to use the values corresponding to the amplitude which is closest to the estimated amplitude. For example, if A is again between $A_1$ and $A_2$, and $|A-A_1| \leq |A_2-A|$, meaning that A is closer to $A_1$ than to $A_2$, and then we may use $Ph_{1i}$, $VE_1$, $DE_1$ and $a_{1i}$ as the phase and adaptation parameters for the i th harmonic.

The harmonic magnitude is also related to the input signal 100 frequency. From the measured real data, the frequency dependence can be approximately represented by a linear equation. For a fixed amplitude A, the magnitude of the i th harmonic is approximately given by $$g_i' = p_i(A)*f + q_i. \quad \text{(Eq.28)}$$

By selecting a specific frequency $f_0$ (for example, $f_0=1$ kHz) as reference, the harmonic at frequency $f$ for amplitude A will be $$g_i' = g_{i0}' + p_i(A)*(f - f_0), \quad \text{(Eq.29)}$$

where $g_{10}'$ is the harmonic magnitude after the amplitude and timing error adjustments (Equations 21-24,27). Further analysis shows that the frequency factor $p_i(A)$ is a linear function of the amplitude A. Similarly, by selecting an amplitude $A_0$ (for example, $A_0=-20$ dBFS) as reference, $p_i(A)$ is given by $$p_i(A) = p_i(A_0) + (A-A_0)*k_i, \quad \text{(Eq.30)}$$

where $k_i$ is the linear parameter that corrects the frequency compensation component, or frequency factor ($p_i$) as a function of the amplitude of the input signal. Therefore, the final harmonic magnitude, adjusted with respect to amplitude, timing error statistics and frequency for the i th harmonic, is given by $$g_i' = g_{i0}' + (f-f_0)*[p_i(A_0) + (A-A_0)*k_i]. \quad \text{(Eq.31)}$$

The frequency adaptation coefficients are computed by measuring the harmonic amplitudes at the base frequency($f_0$) and the high frequency($f_1$) at amplitude $A_0$. In the case of this embodiment we will mark the high frequency($f_1$) at 5 kHz and the amplitude $A_0$ at $-20$ dB from full-scale. The variable $f_s$ represents the sampling frequency of the audio data at the point the correction is performed. The equations for generating the frequency adaptation parameter for the second harmonic are:

$$P_2 = (H2'-H2)*f_s/(f_1-f_0) \quad \text{(Eq.32)}$$

Where $H_2'$ is the harmonic amplitude at $f_1$ and $H_2$ is the harmonic amplitude at $f_0$. The amplitude is then changed to $A_1$, in this example being $-10$ dB. At $A_1$ the harmonic amplitude is again measured at $f_0$ and $f_1$, with respective values $H_2''$ and $H_2'''$. These values are then input into the equation to calculate the second frequency adaptation parameter, k.

$$k_2 = [(H2'''-H2'')*f_s/(f_1-f_0) - P_2]/(A_1-A_0) \quad \text{(Eq.33)}$$

The frequency adaptation parameter is stored separately in the LUT as it is independent of amplitude and therefore only requires one entry.

The look-up table and processing module 118, in one embodiment, can be summarized by the following steps.
 (1). Determine the entry point of the look-up-table based on the estimated amplitude;
 (2). Read the harmonic coefficients and interpolate the harmonic magnitudes $g_i$ with the estimated amplitude;
 (3). Read the adaptation values and compute the harmonic magnitudes $g_{i0}'$ using the adaptation equations and the read back information;
 (4). Update the harmonic magnitude using the frequency adjustment equation to get $g_i'$;
 (5). Read the phase information of the harmonics;
 (6). Complete the harmonic generation and compensate the input signal 100.

An illustrative embodiment of the present invention is implemented with a digital signal processor ("DSP") and field programmable gate array ("FPGA") development tools. For example, a DSP processor, such as an Analog Device ADSP-21161 and a FPGA device such as an Altera Stratix can be used. The DSP takes the digital data from an audio precision source, passes it through the Amplitude and Frequency Estimation module 102, Read Back Circuit 114 and adaptation, then through the Harmonics Compensation module 104 to digitally generate the harmonics and compensate the input signal 100 accordingly. The system, then interpolates the signal 106 and performs noise shaping 108 filtering the data before it is passed to the FPGA. The FPGA receives the data from the DSP and uses a digital counter 166 to generate the rectangular PWM pulses 110, which is to drive the switching power stage 112. The FPGA also receives the read back signal from the feedback circuit and counts the width of the signal pulse and the compensation pulse, calculating the net output signal by taking the difference of the two. This net signal is sent to the DSP and the DSP further processes the signal to get the error and the corresponding statistics such as DE_ref and VE_ref of the error that will be used for the adaptations. The DDX-2060 or DDX-2100 switching power stage, available from Apogee Technology, Inc. in Norwood, Mass., can be used at the power stage in the set-up which supports both stereo and mono applications. Because the timing error changes from device to device, twelve test boards can be assembled with DDX-2060 and DDX-2100 chips that have different lot numbers and therefore production times to form a set of sample space. With the collected data from the twelve boards, the correlation between the harmonic coefficients and timing error statistics are analyzed to obtain the adaptation parameters.

Figure 4:
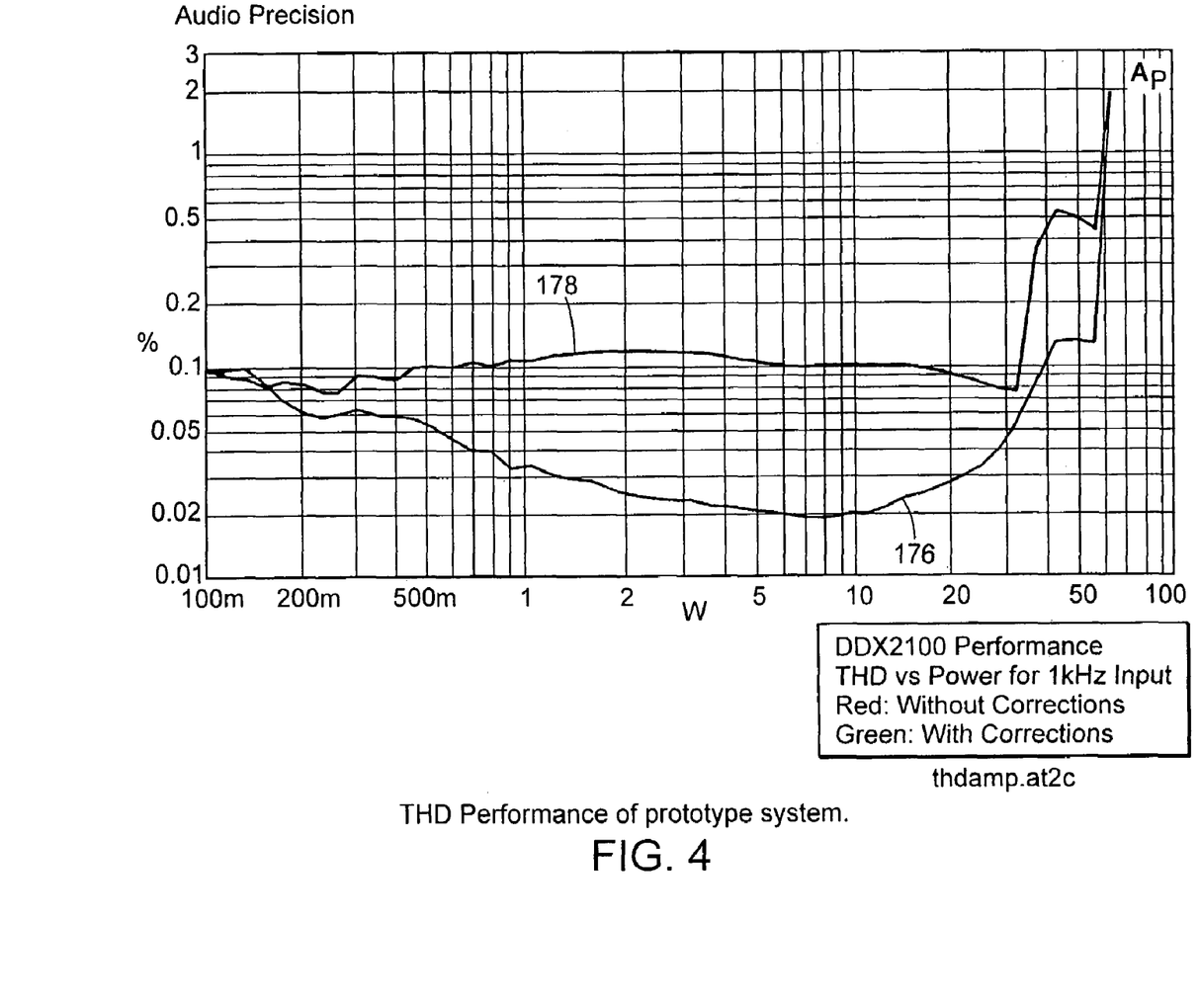
FIG. 4 illustrates the THD performance of the prototype system according to an embodiment of the invention.
Figure 5:
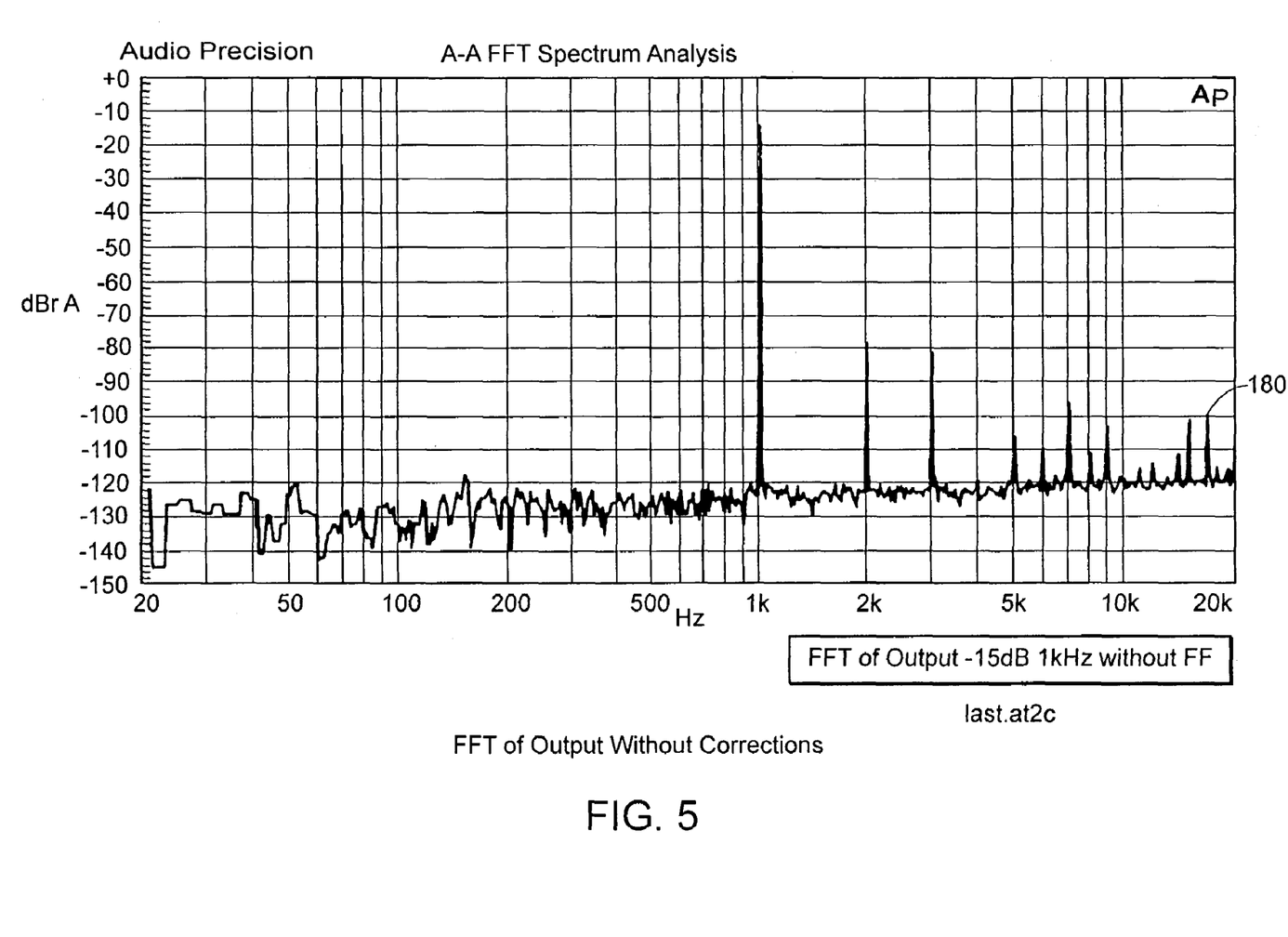
FIG. 5 illustrates FFT of an output signal without harmonic distortion compensation.
Figure 6:
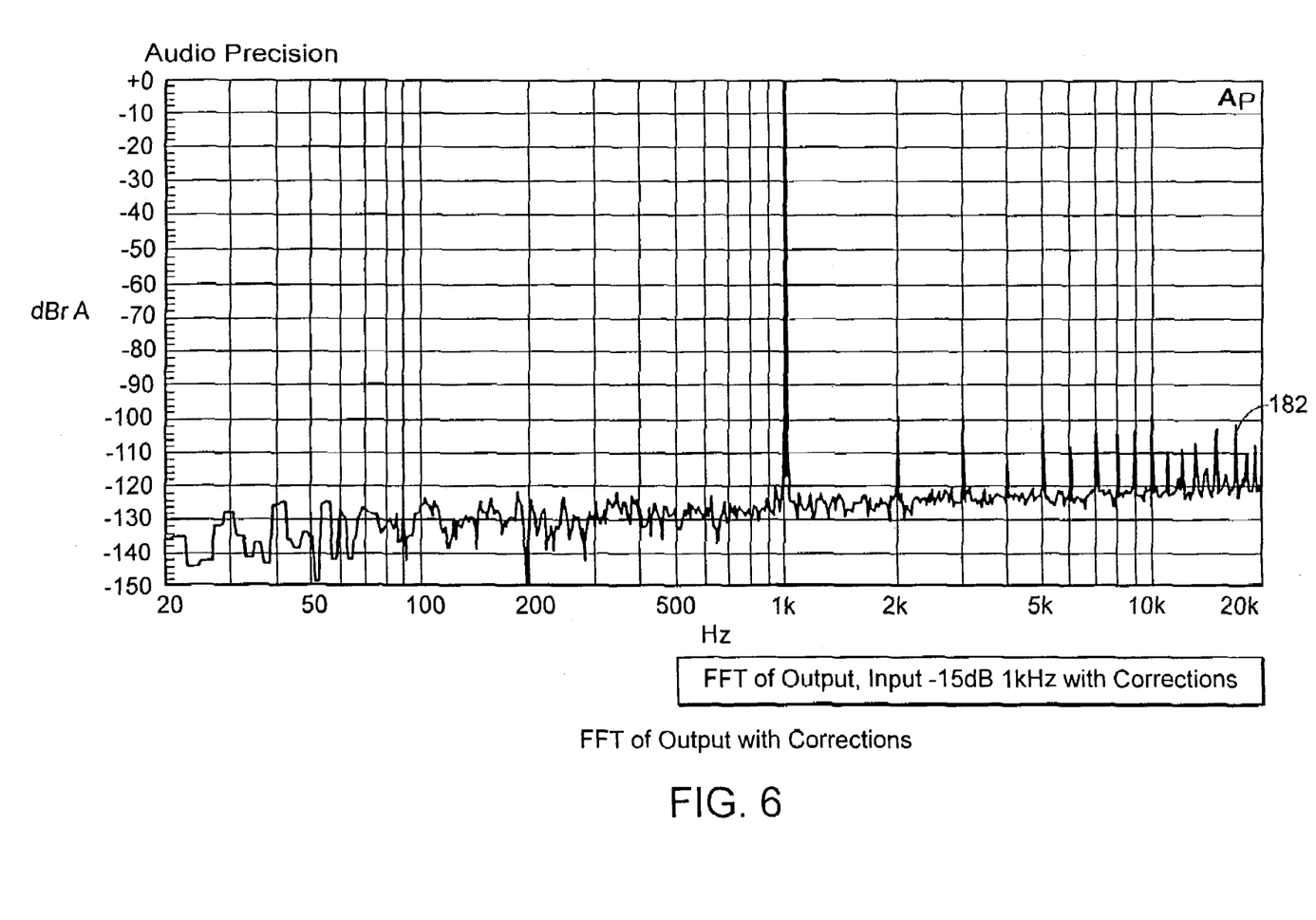
FIG. 6 illustrates FFT of an output signal with harmonic distortion compensation according to an embodiment of the invention.

Turning now to FIG. 4, a sample plot of the results of an illustrative embodiment is shown. The graph plots the THD versus Output power. A corrected signal 176 is shown in relation to the same input signal without corrections to the distortion 178. The corrected signal 176 contains significantly less distortion than the uncorrected signal 178. Implementation of this embodiment with a 5 ns read back resolution yields an absolute limit for the total harmonic distortion plus noise ("THD+N") performance to around 0.01-0.02%. FIG. 5 and FIG. 6 depict a Fast Fourier Transform ("FFT") plot of the same input signal 100 before and after the corrections, respectively. Across the frequency range shown, the output of the corrected signal 182 in FIG. 6 shows a general decrease in THD yielding a maximum THD reduction of approximately 16-18 dB from the uncorrected signal 180 of FIG. 5. The data depicted in FIG. 4-6 was generated from a prototype platform. A non-prototype system is expected to yield better results as the prototype platform had a noise limitation much lower than the known performance, limiting the THD+N from noise. The prototype has a measured signal-to-noise ratio ("SNR") of 92 dB compared to over 100 dB SNR measured in current IC's.

Although the present embodiments are depicted herein as having a separate digital controller and switching power device hardware, those skilled in the art should appreciate that the invention could also be implemented through a single integrated circuit solution, that is the digital controller and switching power device could be implemented in a single IC.

Although the embodiments detailed herein utilize a normalized sinusoidal input signal with a zero phase, one skilled in the art should appreciate that a multitude of input signals could be implemented, i.e., a multi-tone or music input, non-unity amplitude signals, without deviating from the teachings of the invention. Additionally methods such a polynomial modeling or Fourier analysis can be applied to compute the harmonics and/or the inter-modulation products.

Although the present embodiments depict a Read Back Circuit that applies a subtraction or difference calculation to adapt the signal in the comparators, one skilled in the art should recognize that other comparisons, or measurements could be taken of the signal without deviating from the spirit of the invention.

Although the look-up table described in the present embodiments catalogs the values of the variables listed in Table 1, one skilled in the art should recognize that any data useful for signal processing may be collected and stored in the structure of the table without deviating from the teachings of the invention.

In addition to the description of specific, non-limited examples of embodiments of the invention provided herein, it should be appreciated that the invention can be implemented in numerous other applications involving the processing of signals. Although the invention is described hereinbefore with respect to illustrative embodiments thereof, it will be appreciated that the foregoing and various other changes, omissions and additions in the form and detail thereof may be made without departing from the spirit and scope of the invention.

What is claimed is:

1. A device for compensating a digital signal for distortion, the device comprising:
    an estimator configured to receive a first signal, the estimator estimating an initial amplitude and an initial frequency of the first signal;
    a compensator to receive the first signal from the estimator; the compensator determining a harmonic distortion component of the first signal from the initial amplitude and the initial frequency, the compensator to generate a compensated signal from the harmonic distortion component and the first signal;
    logic coupled to the compensator for determining the harmonic distortion component of the first signal from the initial frequency and the initial amplitude;
    at least one comparator to receive an output of a switching power stage, the at least one comparator generating a comparator output, the comparator output at least partially determined by the output of the switching power stage and a reference voltage;
    at least one digital counter configured to receive the comparator output, the at least one digital counter configured to determine a net pulse signal;
    a second circuit in communication with the at least one digital counter, the second circuit to compare a modulator input signal to the net pulse signal to generate an error signal; and
    a circuit operably coupled to the logic, the circuit to modify the harmonic distortion component at least partially based on the error signal.

2. The device of claim 1, wherein the error signal is at least partially derived from a power stage.

3. The device of claim 1, wherein the logic further comprises a processor and a table, the table storing a plurality of reference parameters associated with the harmonic distortion component.

4. The device of claim 1, further comprising:
    an interpolating circuit for interpolating the compensated signal to produce an interpolated signal;
    a noise-shaping circuit for noise-shaping the interpolated signal to produce a noise-shaped signal;
    a pulse-width modulator for pulse-width modulating the noise-shaped signal to produce a pulse-width modulated signal; and
    a switching power stage for receiving the pulse-width modulated signal, the switching power stage to provide a power output signal to a load.

* * * * *